United States Patent [19]
Korsten

[11] Patent Number: 5,358,622
[45] Date of Patent: Oct. 25, 1994

[54] PROCEDURE FOR THE PRODUCTION OF PRINTED CIRCUIT BOARDS PROVIDED WITH PADS FOR THE INSERTION OF SMDS

[75] Inventor: Günter Korsten, Haan, Fed. Rep. of Germany

[73] Assignee: Firma Korsten & Goossens, Fed. Rep. of Germany

[21] Appl. No.: 78,144

[22] Filed: Jun. 16, 1993

[30] Foreign Application Priority Data

Mar. 12, 1993 [DE] Fed. Rep. of Germany ....... 4307784

[51] Int. Cl.$^5$ .............................................. C25D 5/02
[52] U.S. Cl. ..................................... 205/125; 205/123
[58] Field of Search ................................ 205/125, 123

[56] References Cited

U.S. PATENT DOCUMENTS 4,525,246 6/1985 Needham ............................ 205/125

Primary Examiner—John Niebling
Assistant Examiner—Kishor Mayekar
Attorney, Agent, or Firm—Jones & Askew

[57] ABSTRACT

A procedure for producing printed circuit boards with pads for insertion of SMDs. A copper lined base plate is provided with a positive photoprotective layer with a coating thickness lesser or equal to the depth of the pads to be built up for the connection of SMD components. The positive photoprotective layer is exposed using a primary film with a window mask corresponding to the desired pad arrangement, and the exposed base plate is developed in a developing bath such that the photoprotective layer is removed in the area of the exposed windows, exposing open copper areas there. The base plate developed in this way is exposed with a secondary film with a mask for the strip conductors, whereby the strip conductors are modeled as opaque areas. The twice-exposed base plate is electroplated in a tin or tin-lead bath, whereby a tin or tin-lead coating is built up in the region of the open copper area until the pads have been formed by this means with a depth greater or equal to the thickness of the photoprotective layer. The electroplated base plate is developed in a developing bath, whereby the tinplated pad areas and the protective layer regions covered by the opaque strip conductor areas of the secondary film remain. The base plate developed in this way is etched, whereby the laid-open copper areas are removed and the protective lacquer existing in the strip conductor areas is removed, laying bare the copper strip conductor areas.

6 Claims, 3 Drawing Sheets

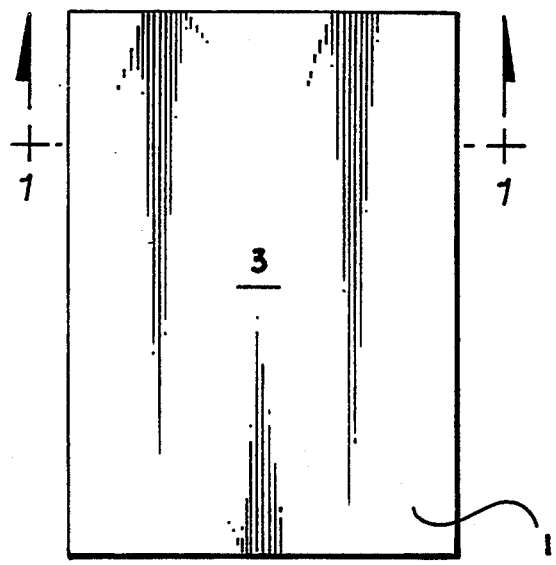
Fig_1
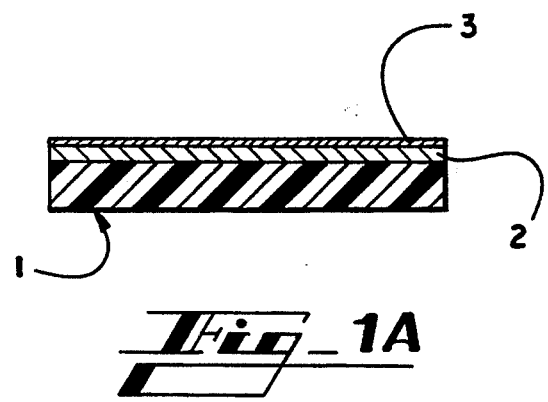
Fig_1A
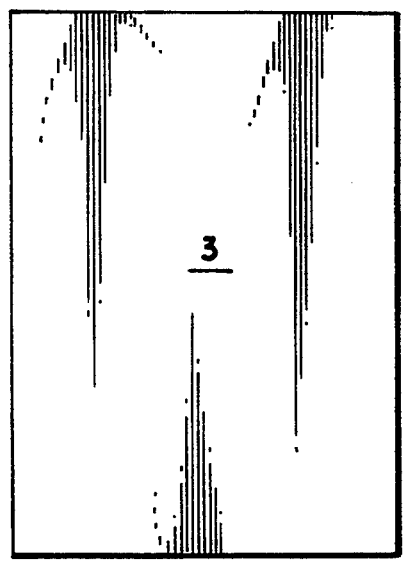
Fig_2
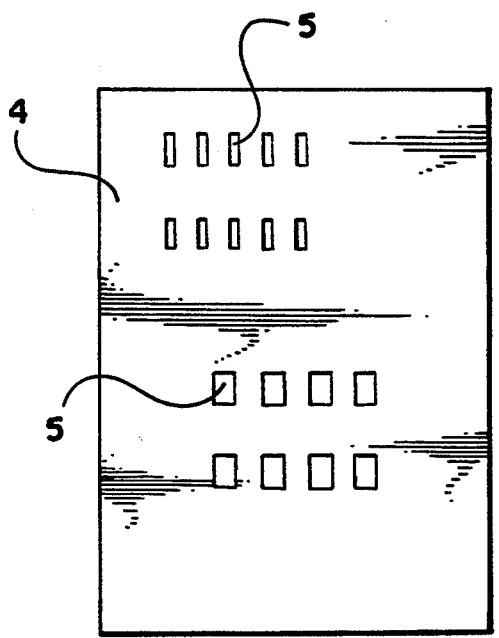
Fig_2A

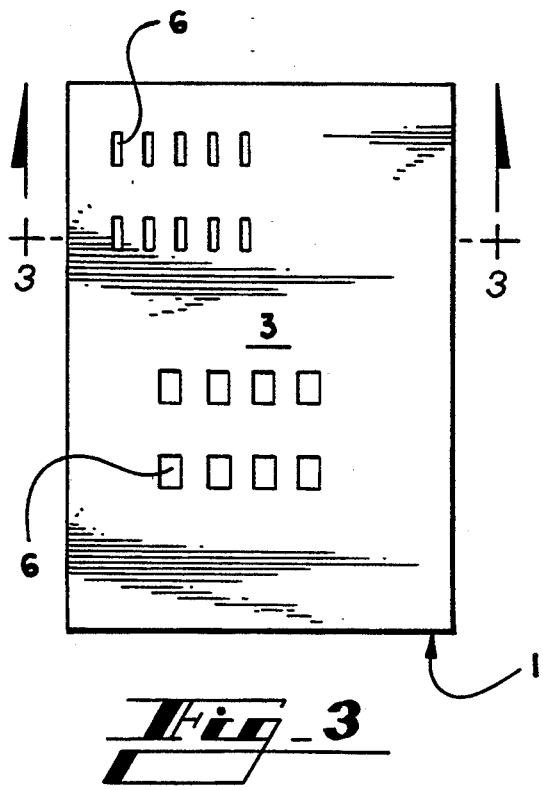
Fig_3
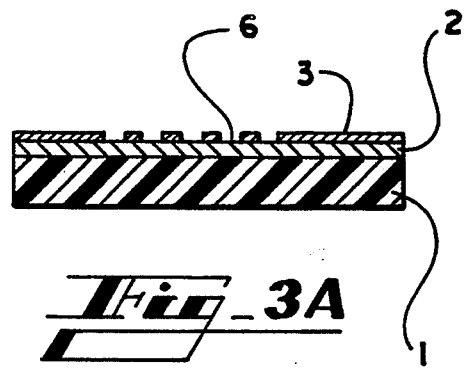
Fig_3A
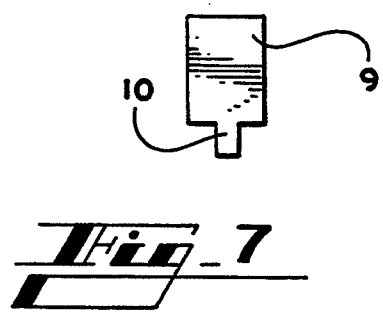
Fig_7
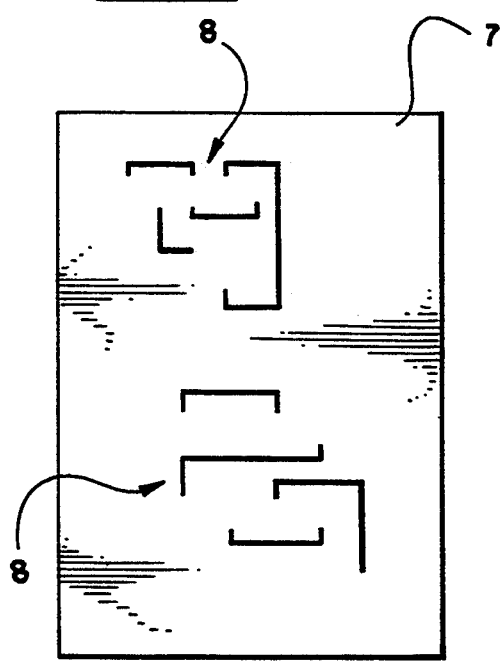
Fig_4
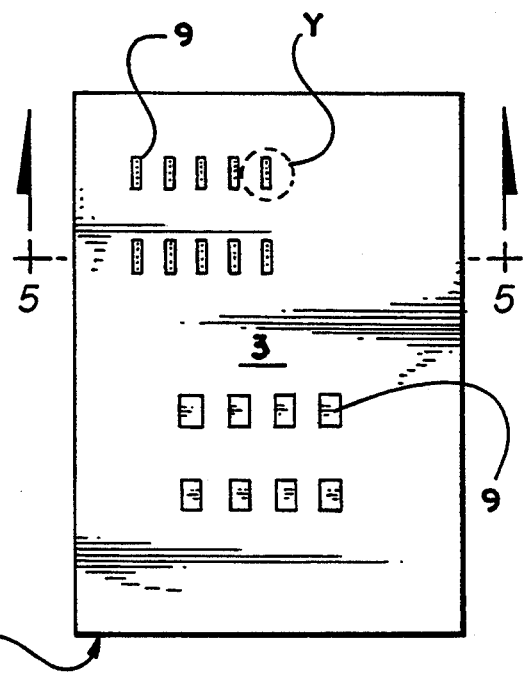
Fig_5

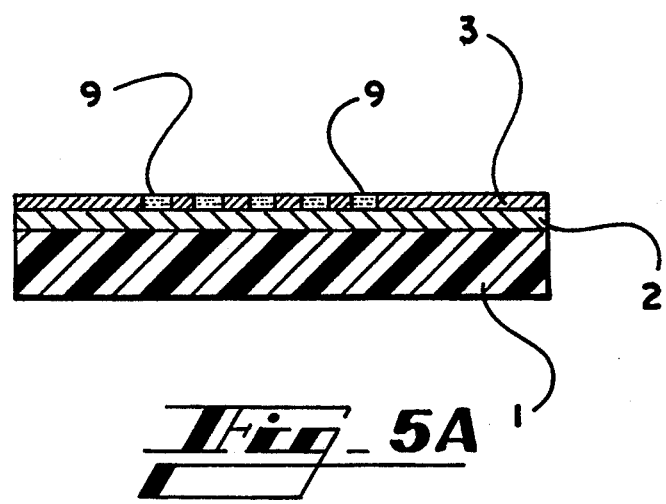
Fig_5A
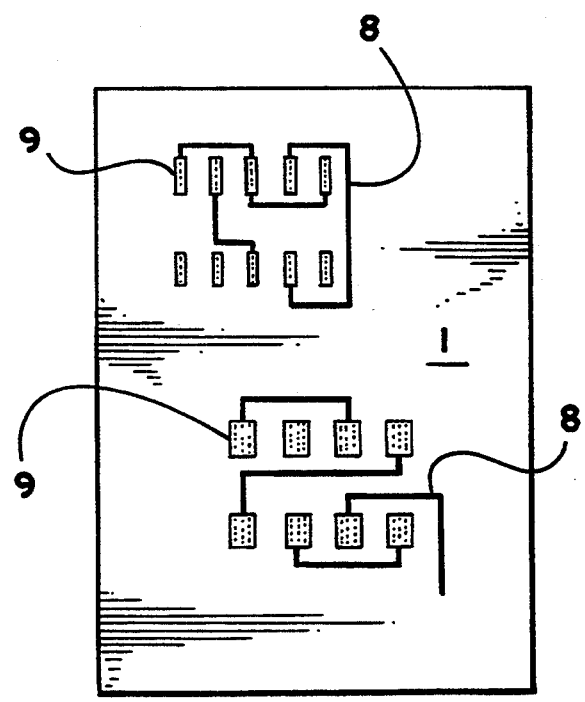
Fig_6

PROCEDURE FOR THE PRODUCTION OF PRINTED CIRCUIT BOARDS PROVIDED WITH PADS FOR THE INSERTION OF SMDS

FIELD OF THE INVENTION

The present invention refers to a procedure for the production of printed circuit boards provided with pads for the insertion of SMDs.

BACKGROUND OF THE INVENTION

Current production of printed circuit boards for the insertion of SMDs takes place, by way of example, through a HAL tin plating. However, severe fluctuations in the effective coating depth occur with this method, and for larger pads, overly light coating levels are frequently ascertained across considerable portions of the pad surfaces with all the negative consequences for subsequent working properties. One such consequence is that the individual connecting legs of the SMD components to be soldered on, ICs, for example, are not soldered.

The so-called optipad printed circuit board procedure is known for eliminating disadvantages of this type; this requires four individual procedural steps. In the first step, application of a temporary solder stop mask with a vacuum laminator takes place over the entire surface of both sides of the printed circuit board. Afterwards, the temporary solder mask is deposited, exposed and developed in a second step. A "cup structure" emerges as a result with precisely defined cavities in the area of the pads to be formed. This cup structure is filled with amounts of solder corresponding to the volume of each of the desired cavities. The solder sets afterward with a flat surface. The temporary solder stop mask is then removed in an aligning step. This procedure is very expensive due to the procedural runoff, which makes an additional mask necessary. In addition, there is a question here of a procedure which requires procedure specific facilities previously not used in the preparation of printed circuit boards.

Also known is the so-called SIPAD procedure, whereby a solder stop foil serving as a pad mask is used as a solder stop resist, and the recesses of the mask filled with solid solder by means of remelting with paste solder such that the surface is aligned level with the solder stop foil. The depth of the solder stop foil and of its recess sets the solder amounts in the solder locations. The SMDs are placed on the solder deposits and then heated to over the soldering temperature. The flat solder deposits deform into round solder bulges in the melting-on process which then rise above the solder stop foil. The level of rise depends, above all, on the geometry of the solder deposit and the soldering atmosphere. After the remelting and eventual cleaning away of the remaining flux, the initially bulge-shaped solder is pressed flat. Likewise, disadvantageous with this procedure there is a very expensive procedural runoff; the printed circuit boards are also exposed to high temperatures a number of times.

SUMMARY OF THE INVENTION

The present invention underlies the purpose of creating a procedure for the production of printed circuit boards provided with pads for the insertion of SMDs, which can be executed using conventional electroplating facilities, affording a favorably priced procedure which insures a pad structure with an even surface and a uniform depth of the individual pads.

This is achieved according to the invention through the following procedural steps:

a) a copper-lined base plate is provided with a positive photoprotective layer with a coating depth lesser/equal to the depth of the pads to be built up for the connection of SMD components, b) the positive photoprotective layer is exposed using a primary film with a window mask corresponding to the desired pad arrangement, c) the exposed base plate is developed in a developing bath such that the photoprotective layer is removed in the area of the exposed windows, laying bare open copper areas there, d) the base plate developed in this way is exposed with a secondary film with a mask for the strip conductors, whereby the strip conductors are modeled as opaque areas, e) the base plate exposed in this way for the second time is electroplated in a tin or tin-lead bath, whereby a tin or tin-lead coating is built up in the region of the open copper areas until the pads have been formed by this means with a depth greater/equal to the thickness of the photoprotective layer, f) the electroplated base plate is developed in a developing bath, whereby the tin-plated pad areas and the protective layer regions covered by the opaque strip conductor areas of the secondary film remain, g) the base plate developed in this way is now etched whereby the laid-open copper areas are removed and the protective lacquer existing in the strip conductor areas is removed, laying bare the copper strip conductor areas.

The present invention is based on the discovery that in electroplating the pads, a level reference surface forms on the top surface of the pads whereby the entire pad does not have to be level to itself. The required pad depth can also be produced at this time by means of the corresponding control, i.e., the electroplating duration such that there is a sufficient solder deposit in the pad. The printed circuit board according to the invention is distinguished in particular by the means that the individual pads each feature the same depth, such that when IC components, for example, are inserted in the printed circuit board according to the invention, all connecting legs of the components are uniformly supported and wetted with tin. Build-up of the pads with tin-lead yields good soldering results. Nevertheless it is also possible to build up the pads solely with tin. It also lies within the scope of the invention to first electrolytically electroplate a copper coating in the region of the developed window areas of the first window mask and a tin-lead coating afterwards.

BRIEF DESCRIPTION OF THE DRAWINGS

The invention is more closely explained with the help of the enclosed drawings. They show:

FIGS. 1–6 The principle sequence of the procedure according to the invention through to the presentation of a printed circuit board according to the invention, FIG. 7 a detail for (Y) in FIG. 5.

DESCRIPTION OF THE PREFERRED EMBODIMENT

A base plate (1) is represented in FIG. 1 which is preferably lined with a copper coating (2), FIG. 1a, and featuring on its top side, a positive photoprotective layer (3). This protective layer (3) can be produced from a lacquer, a resistant film or by means of electrophoresis. The positive photoprotective layer here signifies that, in the case of exposure of the protective layer, the exposed areas can be removed in a developing bath. The coating thickness of the positive photoprotective layer (3) is proportioned such that it is lesser/equal to the depth of the pads to be deposited on the base plate. Pads of this type represent, in the SMD technique, the solder deposit areas onto which the components are soldered, by their connecting legs. Pads of this type must possess a level surface in order for the components to be uniformly wetted with the solder; the coating thickness of the positive photoprotective layer preferably amounts to approximately 10 μm.

Represented in FIGS. 2 and 2a, and indeed in an adjacent arrangement, is, on the one hand, the base plate (1) provided with the positive photoprotective layer (3) and on the other hand a primary film (4) which is provided with a mask of individual windows (5). This window mask corresponds to the desired pad arrangement on the base plate (1). In order to expose the photoprotective layer, the primary film (4) is laid on the protective layer, see arrow (X), and exposed such that the photoprotective layer (3) is exposed in the area of the windows (5), whereas the remaining areas are covered and unexposed.

A base plate (1) is represented in FIG. 3, exposed and developed in a developing bath according to FIGS. 2 and 2a, whereby it is to be recognized that the photoprotective layer in the exposed area of the window mask has now been removed by developing and open copper areas (6) have emerged.

FIG. 3a shows a section along the line III—III in FIG. 3.

The base plate (1) developed in this way is now exposed with a secondary film (7), as represented in FIG. 4. This film (7) features a mask (8) for the strip conductors to be produced, whereby this mask is modeled as an opaque area of the film (7) such that during exposure of the photoprotective layer (3) with the film (7), the photoprotective area (3) is not exposed in the area of the opaque mask (8), rather only in the areas located around the mask (8).

As shown in FIGS. 5 and 5a, the base plate (1) which has been exposed in this way for the second time is now electroplated in an electroplating bath, particularly in a tin bath or a tin-lead bath whereby a tin or tin-lead deposit builds up in the region of the open copper areas (6) in order to form the pads (9). This is shown in FIG. 5a which represents a section along the line V—V in FIG. 5. Electroplating takes place at this time sufficiently long enough to form pads (9) with a depth greater/equal to the depth of the photoprotective layer (3). A uniformly thick and level area for the pads (9) is produced by means of electrolytic deposition according to the invention. Practically any depth for the pads (9) can be obtained through modeling the depth of the photoprotective layer (3) and through a corresponding time/current control in the electroplating bath, such that according to the invention, production of an adequate solder deposit in the pad area can be easily insured. After production of the pads (9) in the electroplating bath, the base plate (1) treated in this way is developed again in a developing bath as shown in FIG. 6 such that the exposed areas to the sides of the unexposed strip conductor areas (8) according to FIG. 5 are freed from the photoprotective layer (3) so that the copper areas of the base plate laid open by this means can be removed in a subsequent etching process. The pad areas and the lacquer protected strip conductor areas remain during this etching treatment and are not affected. The protective layer (3) still remaining on the strip conductor areas is removed in an aligning stripping process such that the copper strip conductors are now laid bare.

As shown in FIG. 7, the pads (9) preferably feature extensions (10) in the region where they connect with the strip conductor areas (8). These are produced simultaneously with the pads (9) by having the window mask, see FIG. 2a, feature recesses on the windows (5) corresponding to the extensions (10). The width of the extensions (10) is adapted at this time to the width of the strip conductor areas. This prevents undercutting radiation during exposure of the secondary film for production of the strip conductor areas and prevents the copper conductor areas from remaining open if the windows (5) of the window mask are larger than the pads (9).

Using the procedure according to the invention it is possible, by virtue of the film masks, to produce very delicate masks and on the other hand the electroplating technique insures a favorable production procedure, since standard existing facilities can be used. Surprisingly, this yields, on the one hand, that the pads produced possess a level surface and, on the other hand, feature a uniform depth to each other; their surfaces consequently lie on a plane affording optimal conditions for SMD insertion. Any pad depth at all can be produced through determining the depth of the photoprotective layer and the duration in the electroplating bath. It is likewise not necessary at this time to match the dwell time in the electroplating shop precisely to the depth of the photoprotective layer, since exceeding the depth of the photoprotective layer with the depth of the tin or tin-lead coating does not impair the properties of the pads produced according to the invention. It is furthermore advantageous that with later insertion of SMD components, the use of expensive metal filled solder pastes can be abandoned and economical flux bonding pastes can be used which are deposited using economical stencils for screen printing. Potential printing inaccuracies are no problem at this time, since the pastes used are not electrically conductive.

It also lies within the scope of the invention if the pads are not constructed solely of tin or tin-lead, but rather if a copper coating is first electrolytically deposited on the copper-lined base plate and then a tin or tin-lead coating [is deposited]. In addition a two-ply printed circuit board can also be produced according to the invention. Multi-ply printed circuit boards can be produced according to the invention in exactly the same way.

What is claimed is:

1. Procedure for the production of printed circuit boards provided with pads having a certain depth for the insertion of surface-mounted devices (SMDs), comprising the steps of:
    a) providing a copper-lined base plate with a positive photoprotective layer having a coating thickness lesser than the depth of the pads to be built up for the connection of SMD components;
    b) exposing the positive photoprotective layer using a primary film with a window mask corresponding to a desired pad arrangement, with the window mask modeling an extension on the pads in a connecting area for strip conductors with the extensions having the approximately width of the strip conductors:

c) developing the exposed base plate in a developing bath such that the photoprotective layer is removed in an area of the windows exposed by the window mask, laying bare an open copper area at the area of each window;

d) exposing the base plate developed in the previous steps with a secondary film with a mask for the strip conductors, whereby the strip conductors are modeled as opaque areas;

e) electroplating the base plate exposed in the preceding steps in a tin or tin-lead bath, whereby a tin or tin-lead coating is built up on the area of the open copper areas until the pads have formed by this step with a depth greater than the thickness of the photoprotective layer;

f) developing the electroplated base plate in a developing bath, whereby the tin or tin-lead plated pad areas and the protective layer regions covered by the opaque strip conductor areas of the secondary film remain alongside unprotected regions of the base plate, laying open the copper areas in the unprotected regions; and g) etching the base plate developed according to the previous steps, whereby the laid-open copper areas are removed and the protective layer existing in the strip conductor areas is removed, laying bare copper strip conductor areas modeled by the mask for the strip conductor.

2. Procedure according to claim 1, wherein the base plate exposed in the step (d) is first electroplated in a copper bath and then in the tin or tin-lead bath, whereby the electroplated copper coating resulting from the copper-bath electroplating is equal or less than the electroplated tin or tin-lead coating.

3. Procedure according to claim 1, wherein pads are modeled on both sides of the printed circuit boards.

4. Procedure according to claim 1, wherein multi-ply printed circuit boards are produced.

5. Procedure according to claim 1, wherein the photoprotective layer is produced from a lacquer, resistant film, or by means of electrophoresis.

6. Procedure according to claim 1, wherein a flux bonding paste is deposited on the pads in a screen printing procedure before insertion with SMD components.

* * * * *